(12) United States Patent  
Kawai et al.

(10) Patent No.: US 7,507,613 B2  
(45) Date of Patent: Mar. 24, 2009

(54) AMBIPOLAR ORGANIC THIN-FILM FIELD-EFFECT TRANSISTOR AND MAKING METHOD

(75) Inventors: Tomoji Kawai, Suita (JP); Masateru Taniguchi, Suita (JP); Eriko Mizuno, Suita (JP); Ikuo Fukui, Joetsu (JP)

(73) Assignees: Osaka University, Suita-Shi, Osaka (JP); Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 11/882,434

(22) Filed: Aug. 1, 2007

(65) Prior Publication Data

US 2007/0281412 A1 Dec. 6, 2007

Related U.S. Application Data

(62) Division of application No. 11/386,670, filed on Mar. 23, 2006, now Pat. No. 7,265,380.

(30) Foreign Application Priority Data

Mar. 25, 2005 (JP) .............................. 2005-088914

(51) Int. Cl.
*H01L 21/00* (2006.01)
*H01L 21/84* (2006.01)
(52) U.S. Cl. ................ 438/149; 438/761; 257/E21.409
(58) Field of Classification Search ................ 438/149, 438/761; 257/192, E21.409
See application file for complete search history.

(56) References Cited

U.S. PATENT DOCUMENTS

| 5,519,812 | A | 5/1996 | Ishihara |
| 7,061,010 | B2* | 6/2006 | Minakata ................. 257/40 |
| 2003/0089904 | A1* | 5/2003 | Yoshida et al. ............ 257/40 |
| 2005/0181566 | A1* | 8/2005 | Machida et al. ........... 438/301 |
| 2005/0274986 | A1* | 12/2005 | Sirringhaus et al. ........ 257/213 |
| 2006/0094172 | A1* | 5/2006 | Lee et al. ................ 438/149 |
| 2007/0215902 | A1* | 9/2007 | Nakagawa ............... 257/192 |

OTHER PUBLICATIONS

Taniguchi et al., 2004, *Applied Physics Letters* (Oct. 11, 2004) 85:15:3298-3300.

* cited by examiner

*Primary Examiner*—Phuc T Dang  
(74) *Attorney, Agent, or Firm*—Birch, Stewart, Kolasch & Birch, LLP

(57) ABSTRACT

In a thin-film field-effect transistor having metal/insulator/semiconductor (MIS) structure, the semiconductor layer is formed of an organic compound, and the insulator layer is formed of an organic compound which is soluble in an organic solvent and exhibits spontaneous polarization similar to ferroelectric material. The transistor exhibits n-type transistor characteristics when polling is conducted by applying a voltage which is not less than a coercive electric field and not more than a withstand voltage between source and gate electrodes, and absent polling, the transistor exhibits p-type transistor characteristics.

17 Claims, 4 Drawing Sheets

AMBIPOLAR ORGANIC THIN-FILM FIELD-EFFECT TRANSISTOR AND MAKING METHOD

CROSS-REFERENCE TO RELATED APPLICATION

This is a divisional application of application Ser. No. 11/386,670, filed Mar. 23, 2006 now U.S. Pat. No. 7,265,380, which is a non-provisional application that claims priority under 35 U.S.C. §119(a) on Patent Application No. 2005-088914 filed in Japan on Mar. 25, 2005, the entire contents of which are hereby incorporated by reference.

TECHNICAL FIELD

This invention relates to a thin-film field-effect transistor (TFT) having a metal/insulator/semiconductor (MIS) structure and more particularly, to such a TFT which uses an organic compound having dielectric properties, especially hysteresis similar to ferroelectric material as the insulator layer, and exhibits both p- and n-type transistor characteristics; and a method for preparing the same.

BACKGROUND ART

Conventional thin-layer field-effect transistors (TFTs) utilizing silicon semiconductor or compound semiconductor are used in general integrated circuits and other expanding applications. While the number of new applications to which such devices are desirably applied is increasing, the requirements of lower cost and flexibility are imposed on these devices. To comply with such requirements, active research works have been made on organic semiconductors because of possible fabrication of devices having a variety of functions including low cost and flexibility. The implementation of organic semiconductors into a commercial practice will lead to the appearance of printable integrated circuits, electronic paper and the like. However, most organic semiconductors exhibit p-type behavior while only C60 and few other materials exhibit n-type behavior. N-type organic semiconductors are key materials for the establishment of organic electronic devices including p-n junctions.

In general, organic semiconductors are not prone to polarity inversion from p-type to n-type, because they have so great a band gap as compared with silicon semiconductor that no inversion layer is formed even when the band is deflected by applying an extra gate voltage. Although the inversion layer may be formed by inducing numerous carriers at the interface between the gate insulating film and the organic semiconductor, a high gate voltage can cause breakdown if a prior art gate insulating film is used. It is thus difficult to induce a sufficient quantity of carriers to provoke polarity inversion.

For instance, Appl. Phys. Lett., Vol. 85, p 3899 (2004) describes to use an aluminum oxide thin film having a high withstand voltage, high dielectric constant and low leakage current as the insulating film and a single crystal as the organic semiconductor. Allegedly the use of a single crystal as the organic semiconductor eliminates the influence of grains and trap level in the semiconductor thin film, and it is thus expected to gain a high mobility. Although the oxide insulator has the advantages of ease of thin film formation and a high dielectric constant, it undesirably has a low withstand voltage due to the essential presence of oxygen vacancies.

DISCLOSURE OF THE INVENTION

An object of the present invention is to provide an ambipolar organic thin-film field-effect transistor which exhibits both p- and n-type transistor characteristics while it can be prepared in a relatively simple manner, and a method for preparing the same.

The inventors have discovered that by using an organic compound as the material of which the semiconductor layer is made and an organic compound which is soluble in an organic solvent and exhibits spontaneous polarization similar to ferroelectric material as the material of which the insulator layer is made, an ambipolar organic thin-film field-effect transistor is obtainable in a relatively simple manner which exhibits both p- and n-type transistor characteristics in that the transistor exhibits n-type transistor characteristics when polling is conducted by applying a voltage which is not less than a coercive electric field and not more than a withstand voltage of the organic compound of the insulator layer between source and gate electrodes, and absent polling, the transistor exhibits p-type transistor characteristics.

Accordingly, the present invention provides an ambipolar organic thin-film field-effect transistor having metal/insulator/semiconductor structure, wherein the material of which the semiconductor layer is made comprises an organic compound, and the material of which the insulator layer is made comprises an organic compound which is soluble in an organic solvent and exhibits spontaneous polarization similar to ferroelectric material, the transistor exhibits n-type transistor characteristics when polling is conducted by applying a voltage which is not less than a coercive electric field and not more than a withstand voltage of the organic compound of the insulator layer between source and gate electrodes, and the transistor exhibits p-type transistor characteristics when polling is not conducted.

In a preferred embodiment, the organic compound of which the insulator layer is made is a polymer having a weight average molecular weight of 2,500 to 1,000,000. In another preferred embodiment, the organic compound of which the insulator layer is made is an insulating polymer having cyano groups, typically an insulating polymer having cyanoethyl groups, and more typically cyanoethylpullulan. Preferably the organic compound of the insulator layer has a withstand voltage of at least 1 MV/cm, a coercive electric field of at least 50 kV/cm, and a spontaneous polarization Pr of at least 1.5 $\mu C/cm^2$.

In another aspect, the invention provides a method for preparing an ambipolar organic thin-film field-effect transistor, comprising the steps of applying a solution of an organic solvent-soluble organic compound in an organic solvent onto a gate electrode in the form of a metal layer, drying the applied solution to form an insulator layer, and laying a semiconductor layer on the insulator layer.

BENEFITS OF THE INVENTION

The thin-film field-effect transistor (TFT) having metal/insulator/semiconductor (MIS) structure according to the invention produces n-type characteristics that are otherwise unachievable by organic field-effect transistors using organic compounds to form the semiconductor and insulator layers. Thus it is an ambipolar organic thin-film field-effect transistor exhibiting both p- and n-type transistor characteristics. This feature allows the inventive transistor to find application in p-n junctions, inverter circuits and lasers.

As opposed to the prior art field-effect transistors of MIS structure that require the photoresist processing steps including patterning and etching involved in the circuit-forming technology using metal-base semiconductor and insulator, the transistor of the invention can be almost prepared by a solvent-basis process since the semiconductor and insulator layers are formed of organic compounds. Namely the transistor of the invention can be prepared simply by a printing technique like ink jet printing, leading to a reduced cost of manufacture.

DESCRIPTION OF THE PREFERRED EMBODIMENTS

Figure 1:
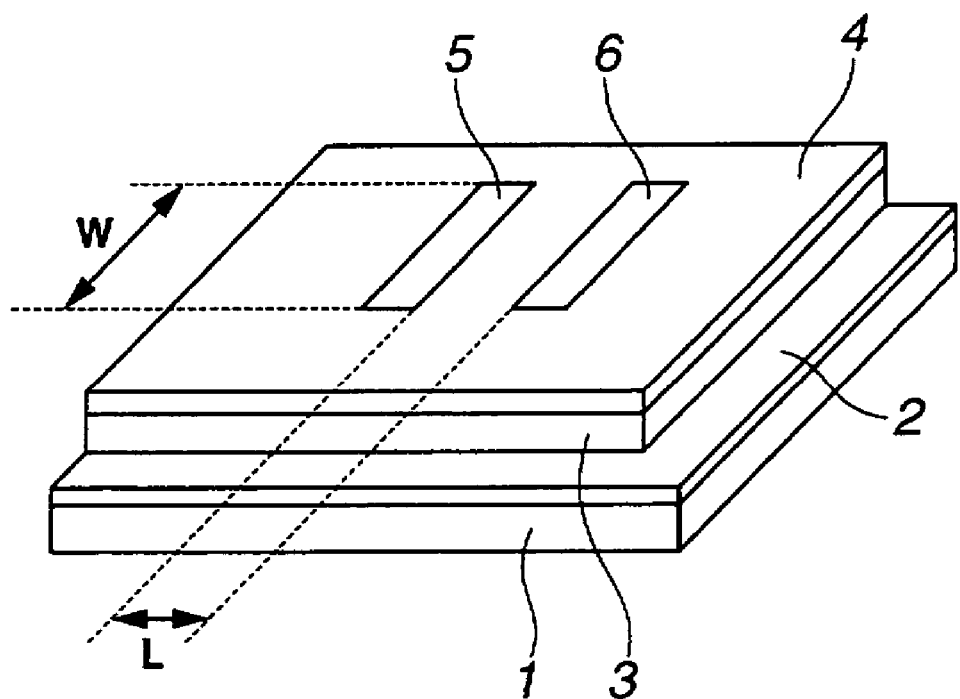
FIG. 1 is a perspective view of an ambipolar organic thin-film field-effect transistor in one embodiment of the invention.

Referring to FIG. 1, the ambipolar organic thin-film field-effect transistor of the invention is illustrated as comprising a substrate 1 of $SiO_2$ or the like, a metal layer 2 formed on the substrate 1 and serving as a gate electrode, an insulator layer 3 formed on the metal layer 2, and a semiconductor layer 4 formed on the insulator layer 3. Source and drain electrodes 5 and 6 are formed on the semiconductor layer 4.

Examples of substrate include glass and a polymer sheet.

The metal layer used herein may be a conventional indium tin oxide (ITO) film, or a single metal layer such as Au, Cu or Al or a metal layer laminate such as Au/Ti, Cu/Ti or Al/Ti which is formed by physical vapor deposition (PVD) or metal organic chemical vapor deposition (MOCVD). Since a possibility of film formation by printing is advantageous to the objects of the invention, the use of conductive metal paste is preferred as long as it raises no practical problems.

Since the polarity inversion phenomenon of semiconductor largely depends on the band alignment between semiconductor and insulator and the quantity of charge accumulated at the interface, the insulator's properties are more predominant from the standpoint of polarity inversion. Accordingly, a thin film that offers transistor performance and can accumulate giant charges at the interface is desired for polarity inversion.

The inventors learned that organic insulating materials generally have a high withstand voltage and deliver low leakage current. As previously pointed out, oxygen vacancies are not avoidable in an aluminum oxide thin film as the insulator film. Likewise, molecular vacancies exist in organic compounds. While oxygen vacancies associated with oxides can alter the electronic state of an insulator, molecular vacancies in organic compounds are not correlated to the electronic state. Then the organic compounds deliver low leakage current. The organic insulating material, however, cannot accumulate a multiplicity of charges at the interface due to a low dielectric constant. Continuing further investigations, the inventors have found that use of a specific organic compound having a high withstand voltage and a high dielectric constant as the insulator layer-forming material enables to construct an ambipolar organic thin-film field-effect transistor exhibiting both p- and n-type transistor characteristics.

The material of which the insulator layer is made is typically an organic compound which is soluble in an organic solvent and exhibits spontaneous polarization similar to ferroelectric material. The preferred organic compound has a withstand voltage of at least 1 MV/cm, a coercive electric field of at least 50 kV/cm, and a spontaneous polarization Pr of at least 1.5 $\mu C/cm^2$.

The organic compound is preferably a high molecular weight compound or polymer having a weight average molecular weight (Mw) of 2,500 to 1,000,000 as measured by gel permeation chromatography (GPC) relative to polystyrene standards, and more preferably an insulating polymer having cyano groups, especially cyanoethyl groups. Examples include cyanoethylpullulan, cyanoethylated dihydroxypropylpullulan, cyanoethyl cellulose, cyanoethyl polyvinyl alcohol, and polyacrylonitrile, with cyanoethylpullulan being most preferred.

The insulating polymer having cyano groups, for example, cyanoethylpullulan is obtained by reacting a pullulan resin (consisting of polysaccharides produced by microorganisms) with acrylonitrile in the presence of an alkali catalyst for substituting cyanoethyl groups for the hydroxyl groups on the pullulan resin (see JP-B 59-31521). Since cyano groups introduced in side chains (cyanoethyl groups in the case of cyanoethylpullulan) have a great polar moment, a more amount of cyano groups introduced leads to a higher dielectric constant (relative permittivity) and hence, a reduction of dielectric loss which is a loss factor.

The insulating polymer having cyano groups preferably has a percent substitution with cyano groups (in the case of cyanoethylpullulan, a percent substitution of hydroxyl groups on pullulan resin with cyanoethyl groups) of at least 80 mol %, and more preferably at least 85 mol %. The upper limit, which is not critical, is theoretically 100 mol %. Cyanoethylpullulan with a percent substitution in this range has a dielectric constant of 19 at 100 Hz to 1 kHz which is very high among polymers, and also has a high withstand voltage of at least 1 MV/cm. Then it is a dielectric material having excellent insulating properties.

Figure 2:
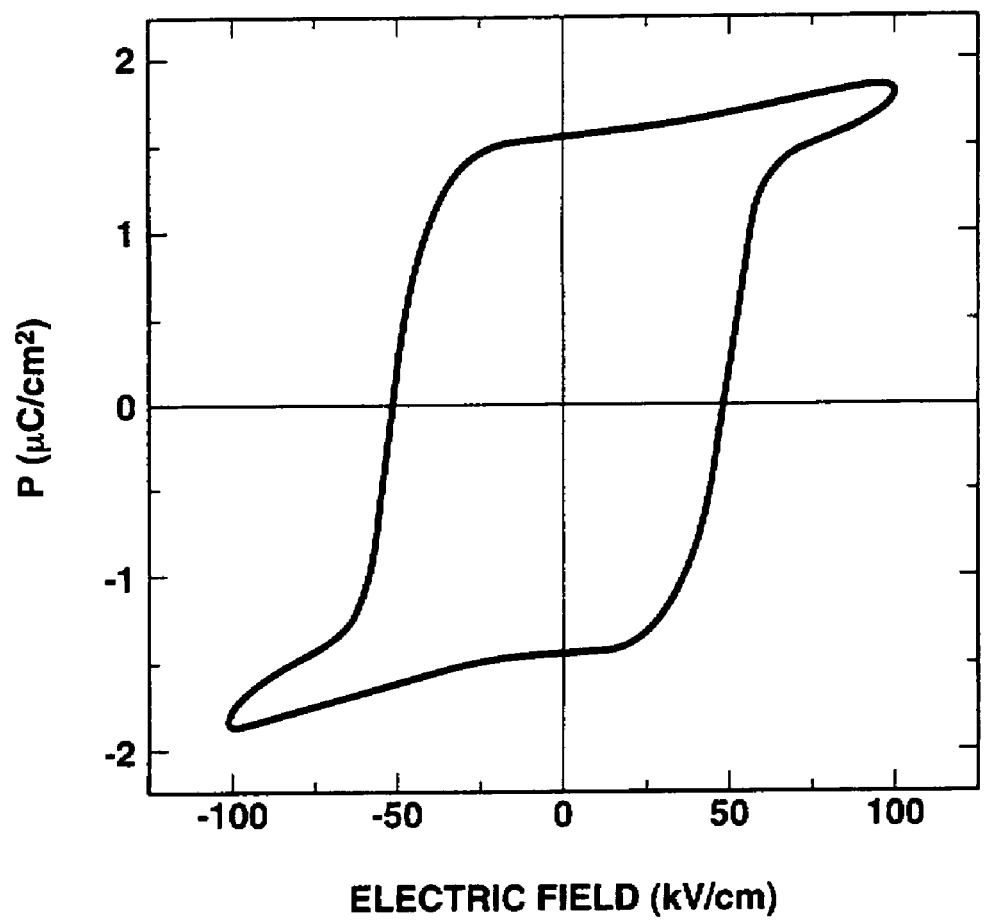
FIG. 2 illustrates P-E curves of a cyanoethylpulluran film.

An insulating film of cyanoethylpullulan was measured for dielectric properties at 1 mHz. Its P-E curve draws a hysteresis loop as shown in FIG. 2. The quantity (P) of charge associated with spontaneous polarization was Pr=1.5 $\mu C/cm^2$, and the coercive electric field was 50 kV/cm. In a linear region of the hysteresis loop between −10 kV/cm and 10 kV/cm, the film has a high electrostatic capacity C of 17.7 $nF/cm^2$. The hysteresis loop of this P-E curve is similar to the ferroelectric material. Accordingly, in the structure using cyanoethylpullulan as the gate insulating film, for example, when polling is performed by applying a voltage (V) of equal to or more than the coercive electric field, a large quantity of charge (Q) conforming to Q=P+CV can accumulate at the interface.

In the ambipolar organic thin-film field-effect transistor of the invention, the material of which the semiconductor layer is made is an organic compound. Specifically, suitable organic compounds for forming the semiconductor layer include low molecular weight compounds such as pentacene, metal phthalocyanine such as copper phthalocyanine and iron phthalocyanine, and α-sexithienyl; and high molecular weight compounds such as polythiophenes, polypyrroles, polyanilines, polyacetylenes, poly(thienylene vinylene)s, and poly(phenylene vinylene)s. In the case of low molecular weight compounds, however, some are difficult to form a film by a so-called printing technique. In this regard, the semiconductor layer prefers an organic solvent-soluble polymer having a weight average molecular weight (Mw) of 2,000 to 1,000,000 as measured by GPC relative to polystyrene standards. Examples of the preferred polymer include polythiophenes, polypyrroles, polyanilines, polyacetylenes, poly(thienylene vinylene)s, and poly(phenylene vinylene)s. In consideration of factors including solubility in organic solvents and ease of processing, polythiophenes, typically poly(3-hexylthiophene) are most preferred.

In forming a semiconductor layer on the insulator layer, ordinary deposition techniques such as vacuum evaporation are employed when low molecular weight compounds are used as the semiconductor layer-forming material. If the organic compound for forming the semiconductor layer has the property of being dissolvable in an organic solvent whether it is low or high molecular weight one, a solution coating/drying process may be employed to lay the semiconductor layer on the insulator layer. In this case, the organic compound for forming the semiconductor layer should be dissolved in an organic solvent in which the insulator layer is not dissolvable. This is because it is generally believed that when a semiconductor layer and an insulator layer are formed by such solution coating lamination, the interface state does not become uniform.

In an example where the organic compound for forming the insulator layer is an insulating polymer having cyano groups, suitable organic solvents in which it is dissolved include N-methyl-2-pyrrolidone, N,N'-dimethylformamide, acetone, acetonitrile, and γ-butyrolactone. The other organic solvent in which the compound for forming the semiconductor layer is dissolved is the solvent in which the insulating polymer having cyano groups is not dissolvable, for example, chloroform, toluene, hexane and alcohols. In either case, one or more solvents may be used.

In the invention, the ambipolar organic thin-film field-effect transistor can be manufactured by well-known methods. For example, a substrate is selected from glass and conventional polymer sheets. A metal layer serving as the gate electrode is formed on the substrate by sputtering or by applying a metal paste or conductive polymer through spin coating, screen printing or ink jet printing, and drying. Alternatively, commercially available ITO-coated glass may be used.

On the gate electrode thus formed, a solution of the insulator layer-forming material in an organic solvent is coated by spin coating, screen printing or ink jet printing, and dried, thus forming an insulator layer.

Thereafter, a solution of the semiconductor layer-forming material in another organic solvent (in which the insulator layer-forming material is not dissolvable) is coated onto the insulator layer by spin coating, screen printing or ink jet printing, and dried to form a semiconductor layer. Alternatively, the material is evaporated in vacuum to deposit a semiconductor layer. Before this stage, the surface of the insulator layer may be subjected to well-known rubbing or physical treatment in order that semiconductor molecules be oriented at the interface between the insulator layer and the semiconductor layer.

Finally, source and drain electrodes are formed on the semiconductor layer by sputtering or by applying a metal paste or conductive polymer through screen printing or ink jet printing, and drying.

Though not critical, it is preferred that the insulator layer have a thickness of 0.2 to 10 μm, more preferably 0.5 to 3 μm, and the semiconductor layer have a thickness of 50 to 300 nm, more preferably 50 to 100 nm. The metal layer has a thickness of 30 to 50 nm.

The transistor exhibits n-type transistor characteristics when polling is conducted by applying a voltage which is not less than the coercive electric field and not more than the withstand voltage of the organic compound of the insulator layer between source and gate electrodes, and the transistor exhibits p-type transistor characteristics when polling is not conducted.

EXAMPLE

Examples of the invention are given below by way of illustration and not by way of limitation.

Example 1

The material for forming the insulator layer was cyanoethylpullulan having a degree of substitution with cyanoethyl groups of 85.2 mol % (CyEPL, by Shin-Etsu Chemical Co., Ltd., CR-S, Mw: 49,000). The material for forming the semiconductor layer was copper phthalocyanine (Aldrich). Using these materials, an ambipolar organic thin-film field-effect transistor was fabricated by the following procedure and then tested.

On a thermally oxidized silicon substrate, a gate electrode was formed by vapor depositing Ti to a thickness of 20 nm and then Au to a thickness of 60 nm, both by RF sputtering at room temperature and a back pressure of $10^{-4}$ Pa.

On the Au surface of the gate electrode, a 15 wt % solution of cyanoethylpullulan in N-methyl-2-pyrrolidone which had been passed through a 0.2-μm membrane filter was spin coated and dried at 100° C. for one hour, forming an insulator layer of 2 μm thick. This insulator layer had an electrostatic capacity of 17.7 nF/cm$^2$ at 1 mHz.

Next, a copper phthalocyanine film of 70 nm thick was formed by vacuum deposition. On X-ray diffractometry analysis, a peak was observed at 2θ=6.8°, indicating that the copper phthalocyanine thin film had alpha-structure.

Next, the substrate was cooled at −20° C., after which Au was deposited on the semiconductor layer to a thickness of 300 nm through a metal mask by RF sputtering at a back pressure of $10^{-5}$ Pa or lower. The source and drain electrodes had a width W of 3.9 mm and were spaced a distance L of 38 μm (see FIG. 1).

The FET thus fabricated was assessed for electrical characteristics under light-shielded condition and a vacuum of $1.3 \times 10^{-3}$ Pa or below.

Without polling on the insulator film, the source-drain current versus voltage $I_{SD}$-$V_{SD}$ curves were measured at room temperature (25° C.) and at different gate voltages. Typical p-type characteristics were observed at negative gate voltages. In the event of positive gate voltages, as the gate voltage increased, the source-drain current decreased and only a depletion layer formed.

Figure 3A:
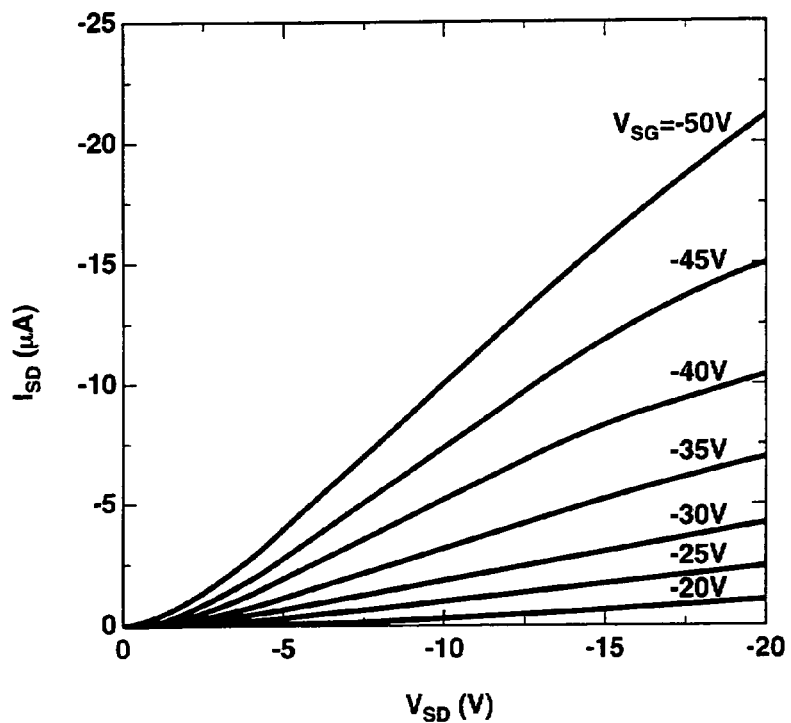
FIG. 3 shows $I_{SD}$-$V_{SD}$ curves at different gate voltages of an ambipolar organic thin-film field-effect transistor in Example 1 after polling, FIG. 3A corresponding to p-type transistor characteristics and FIG. 3B corresponding to n-type transistor characteristics.
Figure 3B:
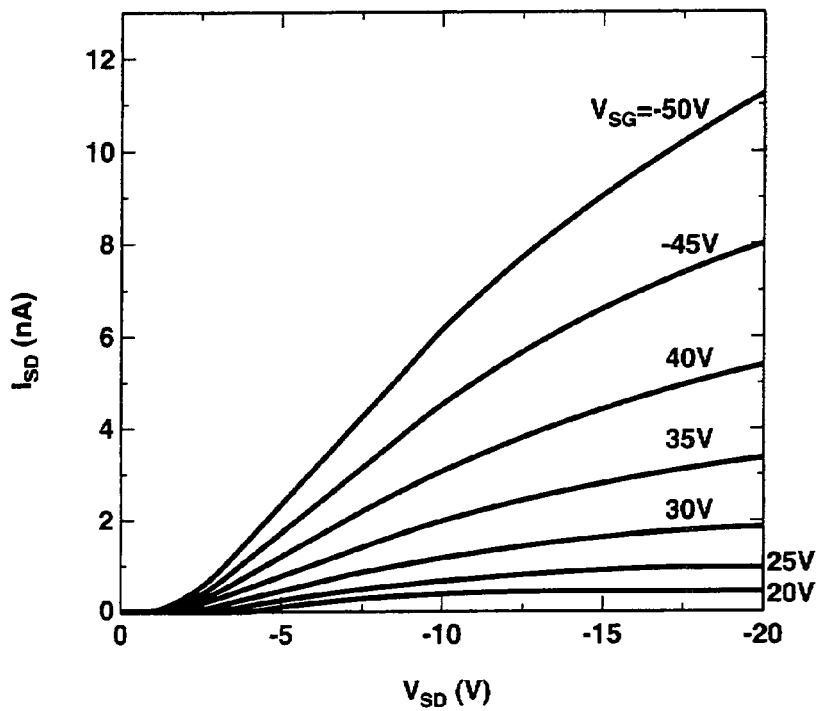

Next, to obtain a large accumulated charge quantity, polling was conducted by applying for at least 2,000 seconds a source-gate voltage ($|V_{SG}|$=20 V) which is more than the coercive electric field, after which the source-drain current versus voltage $I_{SD}$-$V_{SD}$ curves were measured at room temperature (25° C.) and at different gate voltages. When negative gate voltages were applied, as shown in FIG. 3A, the device produced typical p-type transistor characteristics that the current value increases as the gate voltage increases. In contrast, in the event where positive gate voltages were applied, as shown in FIG. 3B, the applied gate voltage promoted depletion with the decreasing current value, but when the gate voltage exceeds 20 V, the device produced n-type transistor characteristics that an inversion layer is formed and the current value increases. Since the copper phthalocyanine layer is of p type and has a significant band gap of 1.5 eV, it takes a weakly inverted state despite a large amount of charges accumulated. For this reason, the n-type source-drain current value is as small as 1/2000 of the p-type source-drain current value (in the event $|V_g|=50$ V). Although the field effect mobility is usually determined from the saturation current value, for this device in which the electrostatic capacity is not determined as Q=CV, the mobility (∫) was estimated from the channel conductance of source-drain current versus source-drain voltage curves. The equation: $I_{SD}=(W/L)\mu[P+C(V_{SG}-V_T)]V_{SD}$ is used wherein $V_T$ is the threshold voltage when the source-drain current rises. The p-type mobility was $4.1\times10^{-3}$ cm$^2$/Vs, which is substantially equivalent to that of a field-effect transistor using silicon oxide as the gate insulating film.

The field-effect mobility for the n-type was $3.5\times10^{-6}$ cm$^2$/Vs which is about 1/1000 of that for the p-type. The on/off ratio of the p-type and n-type at $|V_{SD}|=10$ V was $6\times10^4$ and 70, respectively, and the $V_T$ was −0.1 V and 0.9 V, respectively.

Example 2

The material for forming the insulator layer was cyanoethylpullulan having a degree of substitution with cyanoethyl groups of 85.2 mol % (CyEPL, by Shin-Etsu Chemical Co., Ltd., CR-S, Mw: 49,000). The material for forming the semiconductor layer was iron phthalocyanine (Aldrich). Using these materials, an ambipolar organic thin-film field-effect transistor was fabricated by the following procedure and then tested.

On a thermally oxidized silicon substrate, a gate electrode was formed by vapor depositing Ti to a thickness of 20 nm and then Au to a thickness of 60 nm, both by RF sputtering at room temperature and a back pressure of $10^{-4}$ Pa.

On the Au surface of the gate electrode, a 15 wt % solution of cyanoethylpullulan in N-methyl-2-pyrrolidone which had been passed through a 0.2-µm membrane filter was spin coated and dried at 100° C. for one hour, forming an insulator layer of 2 µm thick. This insulator layer had an electrostatic capacity of 17.7 nF/cm$^2$ at 1 mHz.

Next, an iron phthalocyanine film of 36 nm thick was formed by vacuum deposition.

Next, the substrate was cooled at −20° C., after which Au was deposited on the semiconductor layer to a thickness of 300 nm through a metal mask by RF sputtering at a back pressure of $10^{-5}$ Pa or lower. The source and drain electrodes had a width W of 3.9 mm and were spaced a distance L of 38 µm (see FIG. 1).

The FET thus fabricated was assessed for electrical characteristics under light-shielded condition and a vacuum of $1.3\times10^{-3}$ Pa or below.

Without polling on the insulator film, the source-drain current versus voltage $I_{SD}$-$V_{SD}$ curves were measured at room temperature (25° C.) and at different gate voltages. Typical p-type characteristics were observed at negative gate voltages. In the event of positive gate voltages, as the gate voltage increased, the source-drain current decreased and only a depletion layer formed.

Figure 4A:
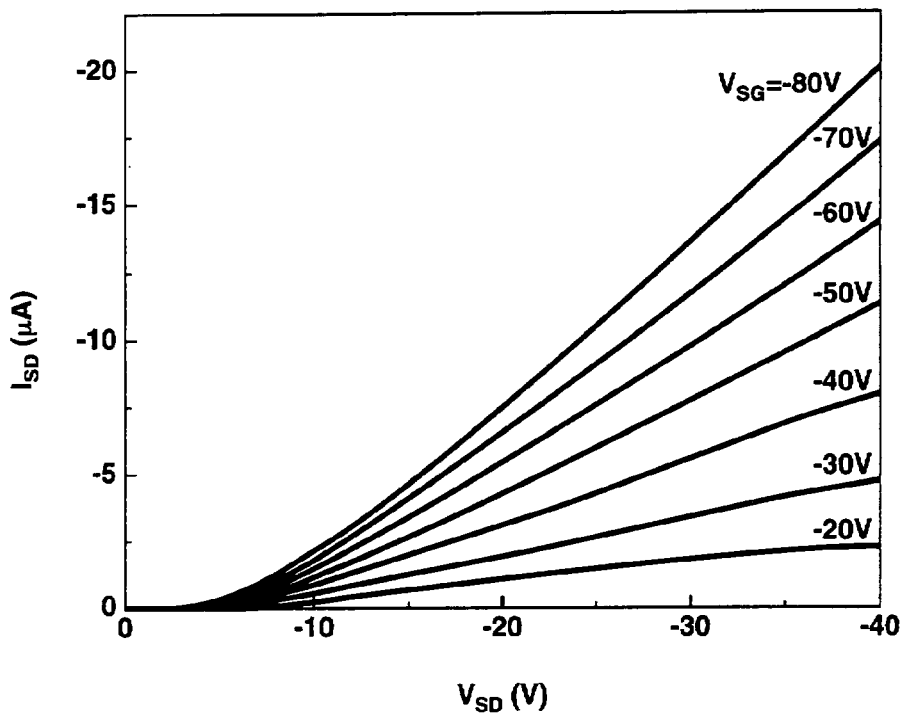
FIG. 4 shows $I_{SD}$-$V_{SD}$ curves at different gate voltages of an ambipolar organic thin-film field-effect transistor in Example 2 after polling, FIG. 4A corresponding to p-type transistor characteristics and FIG. 4B corresponding to n-type transistor characteristics.
Figure 4B:
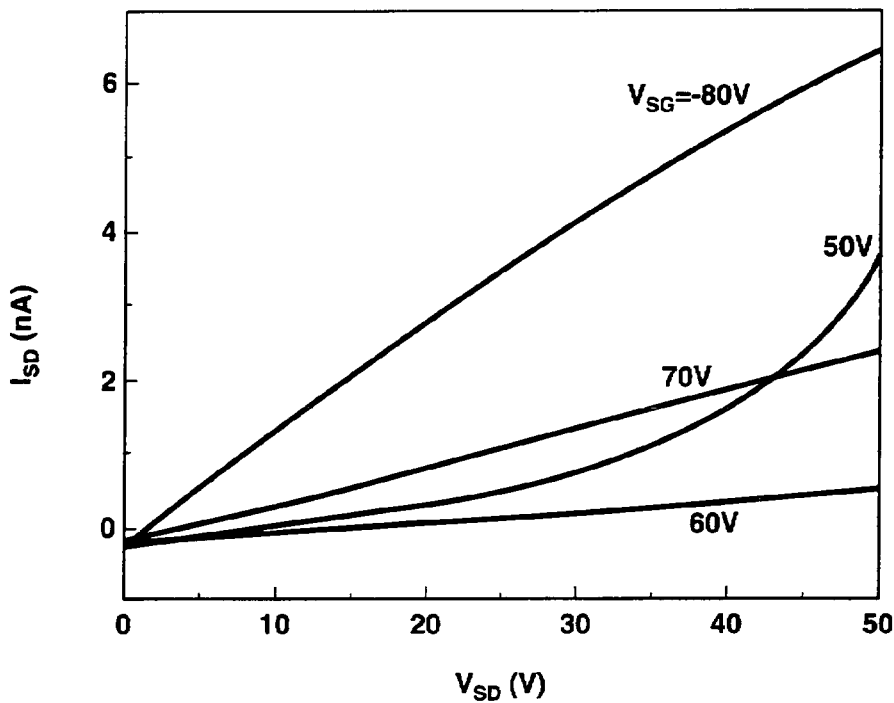

Next, to obtain a large accumulated charge quantity, polling was conducted by applying for at least 2,000 seconds a source-gate voltage ($|V_{SG}|=20$ V) which is more than the coercive electric field, after which the source-drain current versus voltage $I_{SD}$-$V_{SD}$ curves were measured at room temperature (25° C.) and at different gate voltages. When negative gate voltages were applied, as shown in FIG. 4A, the device produced typical p-type transistor characteristics that the current value increases as the gate voltage increases. In contrast, in the event where positive gate voltages were applied, as shown in FIG. 4B, the applied gate voltage promoted depletion with the decreasing current value, but when the gate voltage exceeds 60 V, the device produced n-type transistor characteristics that an inversion layer is formed and the current value increases. Since the iron phthalocyanine layer is of p type and has a significant band gap of 1.4 eV, it takes a weakly inverted state despite a large amount of charges accumulated. For this reason, the n-type source-drain current value is as small as 1/4000 of the p-type source-drain current value (in the event $|V_g|=80$ V). Although the field effect mobility is usually determined from the saturation current value, for this device in which the electrostatic capacity is not determined as Q=CV, the mobility (∫) was estimated from the channel conductance of source-drain current versus source-drain voltage curves. The equation: $I_{SD}=(W/L)\mu[P+C(V_{SG}-V_T)]V_{SD}$ is used wherein $V_T$ is the threshold voltage when the source-drain current rises. The p-type mobility was $1.1\times10^{-4}$ cm$^2$/Vs, which is substantially equivalent to that of a field-effect transistor using silicon oxide as the gate insulating film.

The field-effect mobility for the n-type was $1.7\times10^{-6}$ cm$^2$/Vs which is about 1/65 of that for the p-type. The on/off ratio of the p-type and n-type at $|V_{SD}|=40$ V was $3.5\times10^3$ and 70, respectively, and the $V_T$ was −4.3 V and 4.0 V, respectively.

Japanese Patent Application No. 2005-088914 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for preparing an ambipolar organic thin-film field-effect transistor, comprising the steps of:
    applying a solution of an organic solvent-soluble organic compound in an organic solvent onto a gate electrode,
    drying the applied solution to form an insulator layer,
    laying a semiconductor layer on the insulator layer, and
    conducting polling by applying a voltage which is not less than the coercive electric field and not more than the withstand voltage of the organic compound of the insulator layer between source and gate electrodes thereby inverting polarity from p-type transistor characteristics to n-type transistor characteristics.

2. The method as recited in claim 1, wherein the organic compound in the material of which the insulator layer is made exhibits spontaneous polarization similar to ferroelectric material.

3. The method as recited in claim 1, wherein the organic compound of which the insulator layer is made is a polymer having a weight average molecular weight of 2,500 to 1,000,000.

4. The method as recited in claim 1, wherein the organic compound of which the insulator layer is made is an insulating polymer having cyano groups.

5. The method as recited in claim 1, wherein the organic compound of which the insulator layer is made is an insulating polymer having cyanoethyl groups.

6. The method as recited in claim 1, wherein the organic compound of which the insulator layer is made is cyanoethylpullulan.

7. A method for preparing an ambipolar organic thin-film field-effect transistor, comprising the steps of:
applying a solution of an organic solvent-soluble organic compound in an organic solvent onto a gate electrode,
drying the applied solution to form an insulator layer, and
laying a semiconductor layer on the insulator layer,
said organic compound of which the insulator layer is made having a withstand voltage of at least 1 MV/cm, a coercive electric field of at least 50 kV/cm, and a spontaneous polarization Pr of at least 1.5 $\mu C/cm^2$.

8. The method as recited in claim 1, wherein the material of which the semiconductor layer is made comprises an organic compound.

9. The method as recited in claim 1, wherein the organic compound in the insulator layer-forming material has a high withstand voltage and a high dielectric constant.

10. The method as recited in claim 1, wherein the organic compound of which the insulator layer is made is an insulating polymer having cyano groups with a percent substitution with cyano groups of at least 80 mol%.

11. The method as recited in claim 1, wherein organic compounds for forming the semiconductor layer include low molecular weight compounds such as pentacene, metal phthalocyanine such as copper phthalocyanine and iron phthalocyanme, and α-sexithienyl; and high molecular weight compounds such as polythiophenes, polypyrroles, polyanilines, polyacetylenes, poly(thienylene vinylene)s, and poly(phenylene vinylene)s.

12. The method as recited in claim 1, wherein said step of laying a semiconductor layer is a deposition technique such as vacuum evaporation or a solution coating/drying process.

13. The method as recited in claim 1, wherein a solution of the insulator layer-forming material in the organic solvent is coated by spin coating, screen printing or ink jet printing.

14. The method as recited in claim 1, wherein the insulator layer has a thickness of 0.2 to 10 µm.

15. The method as recited in claim 1, wherein the semiconductor layer has a thickness of 50 to 300 nm.

16. The method as recited in claim 1, wherein the insulator layer has a thickness of 0.5 to 3 µm.

17. The method as recited in claim 1, wherein the semiconductor layer has a thickness of 50 to 100 nm.

* * * * *